United States Patent [19]

Paal et al.

[11] 4,089,766
[45] May 16, 1978

[54] METHOD OF PASSIVATING AND PLANARIZING A METALLIZATION PATTERN

[75] Inventors: Gabor Paal, Stuttgart; Klaus Schackert, Herrenberg, both of Germany

[73] Assignee: International Business Machines Corporation, Armonk, N.Y.

[21] Appl. No.: 807,693

[22] Filed: Jun. 17, 1977

[30] Foreign Application Priority Data

Jul. 3, 1976  Germany .......................... 2629996

[51] Int. Cl.² ...................... C23C 15/00; B29C 17/08
[52] U.S. Cl. .............................. 204/192 D; 156/668; 204/192 E; 204/192 EC
[58] Field of Search .................. 156/668; 204/192 D, 204/192 E

[56] References Cited

U.S. PATENT DOCUMENTS 4,025,411  5/1977  Hom-Ma et al. ............... 204/192 E

OTHER PUBLICATIONS

J. S. Lechaton "Depositing a Sputtered SiO₂ Film Having Maximum Planarization," IBM Tech. Disc. Bull., vol. 17, pp. 2270–2271 (1975).

W. A. Edel et al. "Planarization of Metal Layers for Interconnections on Integrated Circuits," IBM Tech. Disc. Bull., vol. 14, pp. 3837–3838 (1972).

*Primary Examiner*—Aaron Weisstuch
*Attorney, Agent, or Firm*—Theodore E. Galanthay

[57] ABSTRACT

Disclosed is a process for passivating a first metallization pattern on a semiconductor substrate and providing a substantially planar quartz surface for subsequent metallization patterns in which a first polymer layer is applied over a first metallization layer and other portions of the substrate, providing a substantially planar surface. After a first curing, the first layer of polymer material is removed down to a thin layer of defined thickness over the first metallization pattern and, after a second curing, a quartz layer is applied over the polymer layer forming a substantially planar quartz top surface. Also disclosed is a method of forming via holes to the first metallization pattern as well as particular photoresist resins.

7 Claims, 5 Drawing Figures

METHOD OF PASSIVATING AND PLANARIZING A METALLIZATION PATTERN

CROSS-REFERENCE TO RELATED PATENTS, PATENT APPLICATIONS, OR PUBLICATIONS

1. IBM Technical Disclosure Bulletin, Vol. 14, Number 12, May 1972, Pages 3837–3838.
2. IBM Technical Disclosure Bulletin, Vol. 17, Number 8, January 1975, Pages 2270–2271.

BACKGROUND OF THE INVENTION

1. Field of the Invention

The invention relates to a method of passivating and planarizing a metallization pattern on a semiconductor substrate.

2. Description Of The Prior Art

A metallization pattern for connecting components of integrated circuits can be fabricated by applying a metal layer to the full surface of a substrate and spin coating on to this layer a photoresist layer which is exposed through a mask in accordance with the desired metallization pattern. Subsequently, the photoresist is developed and finally, the areas of the metal coating not covered by the photoresist are etched off, yielding a metallization pattern for interconnections. The metallization pattern is then covered with an insulating layer on which a further metallization pattern is formed, which selectively contacts the underlying metallization pattern through via holes. The described sequence of process steps could be repeated one or several times to additionally generate one or several further metallization patterns.

Another prior art technique for generating metallization patterns is the so-called metal lift-off process which was described and claimed for the first time in U.S. Pat. No. 2,559,389. With this method, a polymer layer is applied to a substrate, and parts of this layer are removed from the substrate according to the metallization pattern required. Subsequently, a metal layer is applied to the full surface of the structure described, and the polymer with the metal covering it is selectively removed, leaving a metallization pattern in those areas where it was directly applied to the substrate.

With continued miniaturization of integrated circuits and increasing density, the conductive lines in the metallization patterns have been made narrower and denser. As a result of this, the planarity of the surface of the metallization system has become an essential factor in the manufacture of interconnection systems. The more often a metallization pattern is applied to a surface, the more irregular or non-planar the surface of the overlying, insulating layer becomes. Generally, after the application of three levels of metallization, the surface is so irregular that additional metallization layers can not be applied.

An irregular surface presents two problems which have a direct bearing on the yield and the reliability of the electronic components thus produced. When a metal layer is applied over an irregular surface, the resultant layer becomes thinner in those portions in which the underlying layer has a step. These thinned down portions result in current crowding and possible failure due to electron migration. A further problem relates to the forming of the resist pattern, since clear, distinct exposure becomes impossible as the surface irregularities increase. Accordingly, both the subtractive etching and the lift-off method, have failed to solve the problem of non-planarity of the layer surface.

German OS No. 2,430,692 describes a method of producing via holes in insulating layers, whereby the raised portions in the insulating quartz layer, which are caused by the conductive pattern, are reduced by cathode resputtering until the quartz layer in the area of the via holes to be produced has become perfectly planar. Cathode sputtering is adjusted in such a manner that the deposition rate of the insulating quartz layer is higher than the removal rate of said layer as a result of cathode resputtering. This method has the disadvantage that only conductive lines up to a width of about 5 $\mu$ can be planarized, i.e., the via holes between the first and the second metallization are limited to a diameter of that order. Furthermore, the aluminum surface is impaired by the high cathode resputtering rates, which results in flattened edges of the conductive lines after a cathode resputtering process in comparison with the edge shape after a lift-off process. Furthermore, over the second and third layer of the metallization pattern, the steps resulting from the broader and higher conductive lines can no longer be planarized in full, which often causes difficulties in the edge coverage both in the deep via holes between the second and the third layer and on the edges of the conductive lines.

German Patent Application No. P 26 15 862.3 describes a structure consisting of a substrate and at least one layer, in which the surfaces of the insulating material and the metallization pattern lie essentially in one plane. To produce this structure, a first layer of polyimide is applied to the substrate, to the polyimide layer a second layer of polysulfone is applied, to the polysulfone layer a thin layer of glass resin is applied, and finally to this third layer, a layer of photoresist is applied. The photoresist layer is exposed and developed in such a manner that the negative of the required pattern is obtained. Subsequently, the bared areas of the glass resin layer are removed by means of ion etching in a $CF_4$-atmosphere, and the underlying areas of the second and the first layer are removed by ion etching in an oxygen atmosphere. In a subsequent step, a conductive material of a thickness corresponding to the first polyimide layer is applied to the full surface of the structure. Then the structure is exposed to a solvent which dissolves the polysulfone, so that the overlying layers can be lifted off. In the resultant structure the metallization pattern is embedded in the polyimide layer, and the surfaces of the polyimide and the metallization pattern lie essentially in one plane. The process sequence described has to be repeated for generating the pattern of the via holes and for generating the next metallization pattern. However, this method has the disadvantage that it is very complex and elaborate. For generating the first metallization pattern, the pattern of the via holes and the second metallization pattern, metal has to be vapor deposited three times, so that two interfaces rather than one are formed. This necessarily leads to higher resistances in the via holes, since these are determined by the resistance on the interfaces.

SUMMARY OF THE INVENTION

It is an object of this invention to provide an improved method of passivating and planarizing a metallization pattern, by means of which reliability problems are avoided when several metallization pattern levels are arranged one on top of the other.

It is another object of this invention to provide planar metallization patterns with a relatively simple process that is compatible with reactive ion etching.

Lastly, it is an object of this invention to assure low, uniform resistances in the via holes.

In accordance with the present invention, a layer of polymer material is applied on a semiconductor substrate as well as on the metallization pattern to be passivated and planarized. The polymer layer, after a first curing, is removed down to a thin layer of a defined thickness over the metallization pattern, and after a second curing, a quartz layer is applied to said polymer layer.

In contrast to passivation by means of quartz in accordance with GE-OS 2,430,692, the method of passivating and planarizing metallization patterns in accordance with the present invention not only permits planarizing narrow but also broad conductive lines up to about 90%, i.e., in the subsequently applied quartz layer only about 10% of the full height of the conductive lines are represented. This means that the extremely high steps caused by the super-position of non-planarized structures of multi-layer metallizations can be avoided. Via holes cannot only be arranged over narrow conductive lines, i.e., those that can be planarized by means of quartz, but also over broader ones. In accordance with the present invention the layer thickness of the quartz over structures of different widths is identical, so that the etching of via holes is easier to control. To determine the end point for etching the via holes, no special test structures, as are necessary for quartz-planarized structures, are required. Via holes having a diameter which is smaller or greater than the cross-section of the underlying conductive lines can be simultaneously etched in one layer. Planarization is not accomplished by means of quartz and cathode resputtering, as described in GE-OS 2,430,692, so that the cross-section of the conductive lines is not reduced by the removal of metal as a result of cathode resputtering.

A very essential advantage of the present invention is that the surface of the metallization pattern is protected by a thin layer of polymer material both during the generation of the quartz layer by means of cathode sputtering and during the etching of the via holes into said layer. As a result, very clean metal surfaces are obtained, which leads to uniformly low resistance values in the via holes.

The method in accordance with the present invention for passivating and planarizing a metallization pattern on a semiconductor substrate includes the following process steps:

1. Applying a layer of modified positive photo resist onto the semiconductor substrate and over a first metallization pattern.

2. Heating the arrangement to cure the photoresist.

3. Removing the photoresist layer until a thin layer of a defined thickness is obtained over the metallization pattern.

4. Heating the arrangement for a second curing of the photoresist.

5. Applying a quartz layer to the photoresist layer by means of cathode sputtering.

After application of the quartz layer in accordance with step 5, the first metallization pattern on the substrate surface has been passivated and planarized. To the surface of this quartz layer a photoresist layer is subsequently applied, exposed and developed, forming a mask in accordance with well known photolithographic techniques. Through the mask openings the via holes are etched into the quartz layer. After the via holes have been etched, the second metallization pattern is applied by means of a metal lift-off process or by means of subtractive etching.

The foregoing and other objects, features, and advantages of this invention will be apparent from the following more detailed description of a preferred embodiment of the invention as illustrated in the accompanying drawings.

DETAILED DESCRIPTION

Figure 1:
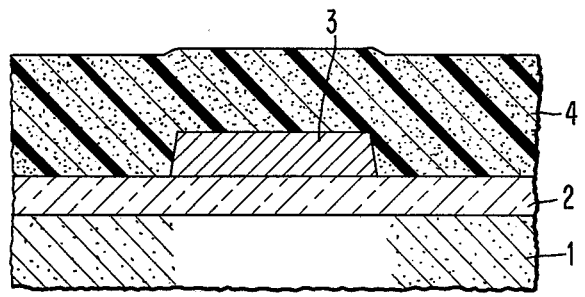
FIGS. 1 to 3 are sectional views of a part of a structure depicted in different processing stages in accordance with the present invention.

FIG. 1 shows a substrate 1 consisting of monocrystalline silicon or another semiconductor material and which is covered with a layer 2 of a dielectric material, such as silicon dioxide or silicon nitride. The substrate 1 consists of an integrated circuit which contains active and passive components (not shown) as well as means for electrically isolating the components from each other (not shown). Layer 2 has contact holes (not shown) for contacting the active and passive components. The substrate can also consist of an insulating material when a metallization pattern is to be generated on a module for integrated circuits. On the layer 2 of dielectric material a metallization pattern 3 of aluminum or aluminum/copper/silicon is arranged which, by means of via contacts (not shown), is connected to the active and passive components in substrate 1. The height of the conductive lines is about 0.8 to 0.9 $\mu$, and the width of the conductive lines is about 5 $\mu$. Onto layer 2 with the metallization pattern 3 to be passivated, a layer 4 of a modified positive photoresist is applied by means of a spin coating method at 3000 revolutions per minute. As a positive photoresist the AZ 1350 J photoresist by Shipley Comp. Inc., TM Newton, Mass., is preferably used. This resist is a light-sensitive polymer inhibitor compound of a m-cresol formaldehyde resin and a 5-substituted diazonaphthoquinone which is identified as 3, 4-dihydroxybenzophenone-4-[naphthoquinone (1, 2) diazide (2)]-sulfonate and which is dissolved in ethyleneglycol-monoethylether acetate. To 1000 ml of this photoresist is added 9.0 L g Monazoline C of Mona Industries Inc. TM, which is a 1-hydroxyethyl-2-alkyl-imidazoline with a $C_7$ to $C_{17}$ alkyl group, and 22 g Luperox 101 by Wallace Tiernan Co. TM, which is a 2, 5-dimethyl-(2, 5-bis-tert-butyl)-peroxo-hexane. To cure the layer of modified positive resist, the wafers are heated in a horizontal position 250° C in an oven in a nitrogen atmosphere. The aforementioned process steps leave a relatively planar top surface, with only a very slightly raised portion over the metallization pattern 3.

Figure 2:
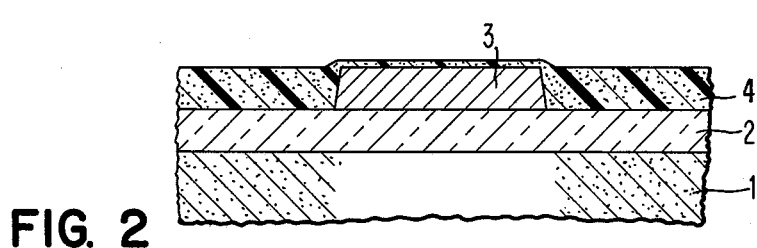

After curing, the photoresist layer, as shown in FIG. 2, is removed down to a thin layer of a defined thickness ranging between 1000 to 2000 A over the conductive lines. The photoresist layer is removed in an aqueous solution with a phosphoric acid content of about 10 percent by weight and a potassium permanganate content of about 0.5 percent by weight. Solutions of this kind are suitable for the development of positive resist materials on a novolak basis (German Patent Application P 24 47 225.1). After removal of the photoresist layer, the structure is heated for one hour in nitrogen to 450° C. Subsequently, the passivating and planar polymer layer is completed, and has a resultant structure illustrated in FIG. 2 by reference numberal 4.

Figure 3:
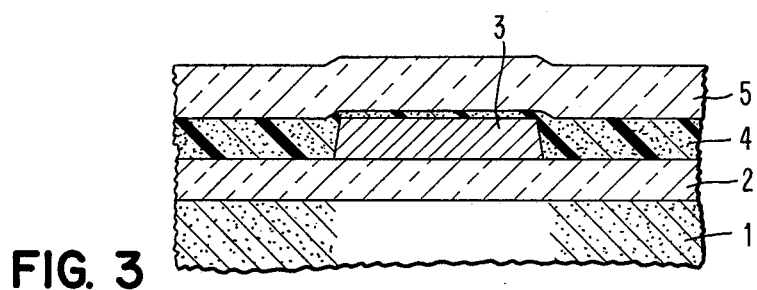

Refer now to FIG. 3, which shows a thick quartz layer 5 (about 1.5 μ) applied over layer 4 by cathode sputtering. This quartz layer 5 is resistant to reactive ion etching in an atmosphere containing oxygen, as used in a lift-off process of the subsequent metallization. Thus, quartz layer 5 provides a substantially planar surface for subsequent metallization layers.

Figure 4:
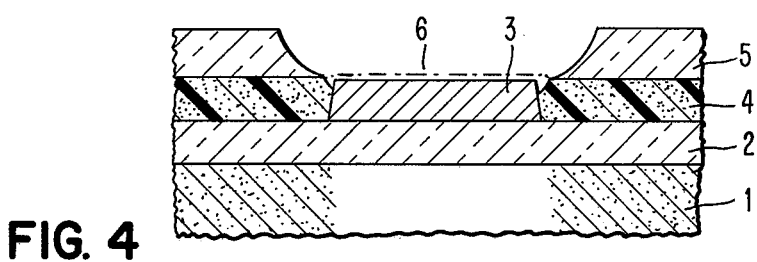
FIG. 4 is a sectional view of a part of a structure after the via holes have been etched into the quartz layer.

Refer now to FIG. 4 which illustrates the etching of via holes 6 into quartz layer 5, down to the first metallization lines by means of well known photolithographic processes. The diameter of the via holes is preferably equal to the width of the conductive lines. With continued reference to FIG. 4 refer also to FIG. 5 which illustrates the appearance of the structure after application of the second metallization pattern 7.

The second metallization pattern 7 is applied in a known manner, for example, by a lift-off process or by a subtractive etching process. During the lift-off process, a 1st photoresist layer of, for example, AZ 1350 J by Shipley Comp. Inc. TM is applied to the surface of the quartz layer 5 in FIG. 4, and to the resist layer a thin masking layer of glass resin is applied. The glass resin is resistant to reactive ion etching in an oxygen atmosphere. The glass resin layer is followed by a 2nd photoresist layer of, for example, AZ 111 by Shipley Comp. Inc. TM, which is a carboxymethylether of formaldehyde resins with an o-diazoarylquinon-inhibitor. The 2nd photoresist layer is exposed through a mask and developed in such a manner that a negative of the required metallization pattern is formed therein. The areas of the glass resin layer and of the 1st photoresist layer lying under the mask openings in the 2nd photoresist layer are subsequently removed by reactive ion etching, whereby straight, vertical side walls are formed. During ion etching (also known as plasma etching), the substrate with the above-mentioned layer sequence is exposed to a reactive ion plasma. A suitable apparatus for implementing this process step is described in U.S. Pat. No. 3,598,710. During the removal of the glass resin areas, the atmosphere of the reaction chamber contains CF$_4$, for removal in the required areas of the 1st photoresist layer and the thin layer of photoresist modified in accordance with the invention and arranged over the first metallization, the atmosphere in the cathode sputtering apparatus is exchanged against an oxygen atmosphere.

Figure 5:
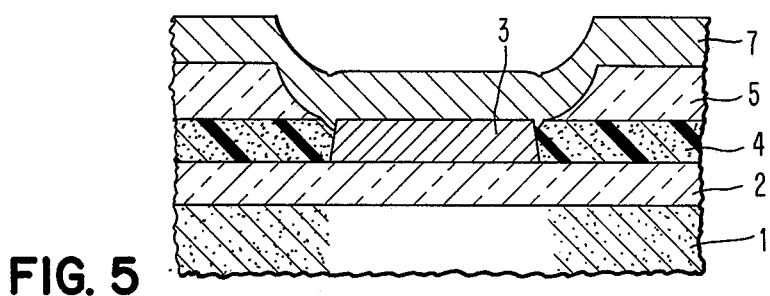
FIG. 5 is a sectional view of a part of a structure with a second metallization pattern.

The reactive ion etching is followed by a cleaning step for the surface of the first metallization bared in the via holes. For this purpose ammonium fluoride buffered hydrofluoric acid at a ratio of 5:1 to 7:1 is used. Then the second metallization, for example, aluminum aluminum/copper/silicon, is vapor deposited on the full resultant surface of the substrate, whereby the surface of the glass resin layer and the areas of the first metallization bared in the via holes are covered with metal. In a lift-off process the first photoresist layer of AZ 1350 J and the overlying layers of glass resin and metal are removed, yielding the second metallization pattern. FIG. 5 shows the resultant structure in which the second metallization pattern 7 is arranged on the quartz layer 5.

If the second metallization is to be applied by means of a substractive etching method, then prior to the application of the second metal layer, the thin layer of modified photoresist over the first metallization in the via holes must be removed by reactive ion etching in an oxygen atmosphere. If a further metallization pattern is to be applied, then the process steps explained by means of FIGS. 1 to 3 can be repeated, yielding a planar layer of modified photoresist over the second metallization and a quartz layer arranged over said resist layer. Further processing and application of the third metallization pattern are carried out in a known manner.

As an alternative to the AZ 1350 J photoresist by Shipley Comp. Inc. TM, described in the embodiment, the planarizing and passivating photoresist layer 4 referred to in the above-mentioned embodiment can also be manufactured of soluble phenol-formaldehyde resins obtainable under the trade names Alnovol 429 K and Varcum 6001 from American Hoechst TM, as well as of any o-diazoarylquinone novolak-based photoresist materials. Apart from the above-mentioned 2, 5-dimethyl-(2, 5-bis-tert-butyl)-peroxohexane, other known polymerization initiators, such as benzoylperoxide, azobisisobutyronitril can be used as a radical forming agent for curing the polymer layers. Also suitable are thermally curable pheno-formaldehyde resins, such as CKM 1282, produced by Union Carbide TM.

In accordance with the present invention both narrow and wide metallic conductive lines can be planarized up to about 90%, i.e., of the full height of the metal only about 10% are represented in quartz. A further advantage is that via holes can be arranged over metallic conductive lines of random width. In addition, it was measured that the via holes have very low and uniform resistances. This is due to the fact that both during the application of the quartz layer by means of cathode sputtering and during the etching of the via holes the surface of the first metallization pattern is covered by a thin polymer layer, so that very clean metal surfaces are ensured.

While the invention has been shown and particularly described with reference to preferred embodiments, it will be understood by those skilled in the art that various changes in form and detail may be made therein without departing from the spirit and scope of the invention.

What is claimed is:

1. A process for passivating a metallization pattern on a substrate and for providing a substantially planar top surface for subsequent layers of metallization comprising the steps of:
   providing a substrate with a first metallization pattern thereon;
   applying a polymer material over said substrate and said metallization such that said polymer material will have a substantially planar top surface;
   heating said structure as a first curing step for said polymer material;
   removing said polymer material down to a thin layer of defined thickness over the first metallization pattern;
   heating said resultant structure providing a second curing for said polymer material; and
   applying a layer of quartz over said polymer layer.

2. A process as in claim 1 wherein said polymer material is a photoresist comprising:
   a resin selected from the group consisting of o-diazoarylquinone/phenolformaldehyde resin and a soluble formaldehyde resin with a content of a radical forming agent.

3. A process as in claim 2 wherein said radical forming agent comprises:
  peroxidic polymerization initiators, azobisisobutyronitril or thermally curable phenol-formaldehyde resins.

4. A process as in claim 1 wherein the step of applying said layer of polymer material comprises:
  applying said polymer material by means of a spin coating process.

5. A process as in claim 1 wherein the step of removing said cured layer of polymer material is performed by the method comprising the step of:
  removing the polymer material in a solution containing phosphoric acid and potassium permanganate down to a thin layer of a defined thickness over the metallization pattern.

6. A process as in claim 1 wherein the step of curing said polymer layer for the second time comprises the step of:
  performing the second curing at a higher temperature than the first curing.

7. A process as in claim 1 wherein the step of applying the quartz layer comprises the step of:
  applying the quartz layer by means of cathode sputtering.

* * * * *